United States Patent [19]
Dmitriev et al.

[11] Patent Number: 5,679,153
[45] Date of Patent: Oct. 21, 1997

[54] METHOD FOR REDUCING MICROPIPE FORMATION IN THE EPITAXIAL GROWTH OF SILICON CARBIDE AND RESULTING SILICON CARBIDE STRUCTURES

[75] Inventors: Vladimir A. Dmitriev, Fuquay-Varina, N.C.; Svetlana V. Rendakova; Vladimir A. Ivantsov, both of St. Petersburg, Russian Federation; Calvin H. Carter, Jr., Cary, N.C.

[73] Assignee: Cree Research, Inc., Durham, N.C.

[21] Appl. No.: 346,618

[22] Filed: Nov. 30, 1994

[51] Int. Cl.⁶ .................................................. C30B 29/36
[52] U.S. Cl. .......................... 117/106; 117/54; 117/109; 117/951; 457/100
[58] Field of Search .......................... 117/951, 109, 117/106, 54; 437/100

[56] References Cited

U.S. PATENT DOCUMENTS

| | | | |
|---|---|---|---|
| 4,123,571 | 10/1978 | Balog et al. | 427/249 |
| 4,419,336 | 12/1983 | Kuriakose | 423/345 |
| 4,866,005 | 9/1989 | Dmitriev et al. | 437/100 |
| 5,027,168 | 6/1991 | Edmond | 357/17 |
| 5,265,118 | 11/1993 | Takenaka et al. | 373/117 |
| 5,319,220 | 6/1994 | Suzuki et al. | 257/77 |
| 5,350,699 | 9/1994 | Nii | 437/100 |

FOREIGN PATENT DOCUMENTS

| | | |
|---|---|---|
| 0 538 611 | 4/1993 | European Pat. Off. . |
| 63-156095 | 6/1988 | Japan . |

OTHER PUBLICATIONS

*An Examination of Double Positioning Boundaries and Interface Misfit in Beta–SiC Films on Alpha–SiC Substrates;* H. S. Kong et al., J. Appl. Phys. 83(8), 15 Apr. 1988, pp. 2645–2650.

*Performance Limiting Micropipe Defects in Silicon Carbide Wafers*, P. G. Neudeck, IEEE Electron Device Letters, vol. 15, No. 2, Feb. 1994, pp. 63–65.

*Growth of Large SiC Single Crystals*, D. L. Barrett et al., Journal of Crystal Growth 128 (1993), pp. 358–362.

*Epitaxial Growth of Thick Single Crystalline Cubic Silicon Carbide by Sublimation method*, W. Yoo et al., Mem. Fac. Eng. Kyoto Univ. vol. 49, No. 1 (1987), pp. 21–31.

(List continued on next page.)

*Primary Examiner*—Robert Kunemund
*Attorney, Agent, or Firm*—Bell, Seltzer, Park & Gibson, P.A.

[57] ABSTRACT

A method is disclosed for producing epitaxial layers of silicon carbide that are substantially free of micropipe defects. The method comprises growing an epitaxial layer of silicon carbide on a silicon carbide substrate by liquid phase epitaxy from a melt of silicon carbide in silicon and an element that enhances the solubility of silicon carbide in the melt. The atomic percentage of that element predominates over the atomic percentage of silicon in the melt. Micropipe defects propagated by the substrate into the epitaxial layer are closed by continuing to grow the epitaxial layer under the proper conditions until the epitaxial layer has a thickness at which micropipe defects present in the substrate are substantially no longer reproduced in the epitaxial layer, and the number of micropipe defects in the epitaxial layer is substantially reduced.

32 Claims, 4 Drawing Sheets

OTHER PUBLICATIONS

International Search Report; PCT/US95/15276; filed Nov. 22, 1995; By S. Cook dated May 10, 1996.

*Silicon Carbide p–n Structures Synthesized By Liquid-Phase Epitaxy*, V. A. Dmitriev et al., 8250 Soviet Technical Physica Letters,11(2), Feb. 1985, pp. 98–99.

Derwent Publications Ltd., London; U.S.S.R. 93–115213; 15 Apr. 1992 (Abstract Only).

S. Wang et al., *Characterization of Defect Structures in SiC Single Crystals Using Synchrotron X–Ray Topography*, Mat. Res. Soc. Symp. Proc., vol. 307, 1993, pp.249–254.

V.A. Dmitriev, *Silicon carbide and SiC–AlN solid–solution p–n structures grown by liquid–phase epitaxy*, Physica B, vol. 185, 1993, pp. 440–452.

V.A. Dmitriev et al., *Silicon carbide light–emitting diodes for the blue–violet region*, Sov. Tech. Phys. Lett., vol. 11, No. 2, Feb. 1985, pp. 101–102.

M. Ikeda et al., *Fabrication of 6H–SiC light–emitting diodes by a rotation dipping technique:Electroluminescence mechanisms*, J. Appl. Phys., vol. 50, No. 12, Dec. 1979, pp. 8215–8225.

W.v. Münch et al., *Silicon Carbide Blue–Emitting Diodes Produced by Liquid–Phase Epitaxy*, Solid–State Electronics, vol. 21, 1978, pp. 1129–1132.

H. Matsunami et al., *SiC Blue LED's by Liquid–Phase Epitaxy*, IEEE Transactions on Electron Devices, vol. ED–24, No. 7, Jul. 1977, pp. 958–961.

W.v. Münch, *Silicon Carbide Technology for Blue–Emitting Diodes*, Journal of Electronic Materials, vol. 6, No. 4, 1977, pp. 449–463.

W.v. Münch te al., *Silicon Carbide Light–Emitting Diodes with Epitaxial Junctions*, Solid–State Electronics, vol. 19, 1976, pp. 871–874.

A. Suzuki et al., *Photoluminescence Due to Al, Ga, and B Acceptors in 4H, 6H–, and 3C–SiC Growth from a Si Melt*, J. Electrochem. Soc., vol. 124, No. 2, Feb. 1977, pp. 241–246.

R.W. Brander et al., *Solution growth SiC p–n junctions*, Brit. J. Appl. Phys. (J. Phys. D), Ser. 2, vol. 2, 1969, pp. 309–318.

H. Nagasawa et al., *Suppression of etch pit and hillock formation on carbonization of Si substrate and low temperature growth of SiC*, Journal of Crystal Growth, vol. 115, 1991, pp.612–616.

D.L. Barrett et al., *Growth of large SiC single crystals*, Journal of Crystal Growth, vol. 128, 1993, pp. 358–362.

5,679,153

METHOD FOR REDUCING MICROPIPE FORMATION IN THE EPITAXIAL GROWTH OF SILICON CARBIDE AND RESULTING SILICON CARBIDE STRUCTURES

FIELD OF THE INVENTION

The present invention relates to the epitaxial growth of semiconductor materials in a manner which minimizes crystal defects, and thus enhances the resulting performance of devices made from those semiconductors. In particular, the invention relates to a method of growing low defect silicon carbide epitaxial layers by liquid phase epitaxy (LPE).

BACKGROUND OF THE INVENTION

Silicon carbide (SiC) is an ideal semiconductor for fabrication of solid state devices for many applications, particularly those requiring high power levels. Such applications as aircraft and avionics, turbine engines, space based power systems, and many others require switches and amplifiers capable of handling large currents with relatively low voltage drops. Silicon carbide's fundamental characteristics give it the potential to provide improved performance devices in such applications. For example, the measured electric breakdown field for silicon carbide is in the range of $2-4 \times 10^6$ volts per centimeter (V/cm) depending upon the doping range, a value that is between eight and ten times greater than that of silicon (Si). Thus, power devices fabricated from silicon carbide should be capable of supporting large voltages of both direct (DC) and alternating (AC) current. Successful operation at such high voltages will in turn permit the devices to amplify and switch at large power levels.

Furthermore, because of its relatively wide bandgap, silicon carbide devices can operate at temperatures up to at least about 500° C.

In the last decade, much progress has been made in silicon carbide growth and processing, and in silicon carbide-based devices. For example, in 1984, blue light-emitting diodes in SiC were available only in extremely limited quantities (one or two at a time, and only at very high cost, about $75.00 per diode at then-current prices). In contrast, and as of the filing of this application, the assignee of the present invention, Cree Research, Inc., has been supplying blue light-emitting diodes to commercial markets in annual quantities of millions and at extremely low cost; i.e., about 10¢ per diode at 1994 prices.

High power devices formed from silicon carbide, however, have yet to make a similar commercial appearance or impact, in spite of much evaluation, study, and theoretical and design work. The main limiting factor currently precluding the wider use of silicon carbide for high power devices is the relatively high defect density in silicon carbide substrates, particularly a high density of a type of defect called a "micropipe." As is well understood by those of ordinary skill in the semiconductor arts, the quality of a semiconductor crystal will often significantly affect the quality of devices fabricated from it. Furthermore, defects which pose little or no problem at low voltages, and thus can be overlooked or compensated for in lower power devices, can cause significant problems, including catastrophic failure, in devices operating at higher power levels.

The desirability and advantages of using the same semiconductor material for both the substrate and active regions of a device is well understood by those of ordinary skill in this art. In this regard, the particular advantages of SiC substrates for SiC devices has been thoroughly addressed elsewhere, and will not be repeated herein. See, e.g., U.S. Pat. Nos. 4,912,063, 4,912,064, and 4,866,005.

Of all the various types of defects, micropipes, also referred to as pinholes, are generally catastrophic for almost all types of devices. A micropipe is actually a tubular void with a diameter ranging from a few microns to as high as 0.1 millimeter (mm) that extends along the growth direction. Although silicon carbide wafers typically have some areas that do not contain micropipes, their average density for a silicon carbide wafer, even if otherwise extremely high quality, is between about 100 and 400 $cm^{-2}$, or even as high as 1000 $cm^{-2}$; i.e., measured as the number appearing in a given area of the substrate surface. See, e.g., Barrett, et al., *Growth of Large SiC Single Crystals, Journal of Crystal Growth*, 128 (1993), pp. 358–362.

Although the inventors do not wish to be bound by the theory, it appears that several different mechanisms are responsible for micropipe formation. Some of these mechanisms appear to cause a superscrew dislocation to form at the core, while others are not associated with such dislocations. The other primary type of line defects are mixed dislocations which lie primarily in the basal plane. A primary source of these dislocations appears to be the large strain fields associated with superscrew dislocations.

Defects such as micropipes, pits, inclusions, dislocations, and stacking faults that are present in a substrate usually propagate in any epitaxial structure that is grown on that substrate, and lead to device degradation at particular power levels. Furthermore, although some theoretical explanations appear promising, the mechanisms of micropipe formation are not yet entirely clear, and thus methods to control them are presently less than satisfactory.

Some researchers have attempted to solve the problem by growing epitaxial layers on substrate planes of silicon carbide other than the basal plane. In spite of some success, however, p-n junctions grown on wafer planes perpendicular to the basal plane have less than half the electric field strength of junctions grown substantially parallel to the basal plane.

Thus, although silicon carbide offers tremendous potential for power devices, such devices will not become commercially viable until the crystal characteristics of silicon carbide structures can support such high power levels.

OBJECT AND SUMMARY OF THE INVENTION

Therefore, it is an object of the present invention to provide epitaxial layers of silicon carbide that have substantially reduced micropipe defects.

The invention meets this object with a method of producing epitaxial layers of silicon carbide in which micropipe defects are substantially reduced or eliminated by growing bulk single crystals of silicon carbide using a seeded sublimation technique; forming a first epitaxial layer of silicon carbide on the substrate using a liquid phase epitaxy technique until the layer has a thickness sufficient to close micropipe defects propagated by the substrate into the growth of the first epitaxial layer; and thereafter forming a second epitaxial layer of silicon carbide on the first epitaxial layer by chemical vapor deposition.

In another aspect, the invention comprises a method of growing an epitaxial layer of silicon carbide on a silicon carbide substrate by liquid phase epitaxy from a melt of silicon carbide in silicon and an element that enhances the solubility of silicon carbide in the melt, and in which the atomic percentage of that element predominates over the atomic percentage of silicon, and closing micropipe defects propagated by the substrate into the epitaxial layer by continuing to grow the epitaxial layer until the epitaxial layer has a thickness at which micropipe defects present in the substrate are substantially no longer reproduced in the epitaxial layer.

In yet another aspect, the invention comprises a silicon carbide structure comprising a single bulk crystal silicon carbide substrate, and an epitaxial layer of silicon carbide on a surface of that silicon carbide substrate, with the epitaxial layer being characterized by an x-ray rocking curve having a full width of 25 arc seconds or less at half maximum.

In yet another aspect, the invention comprises a silicon carbide structure formed of a single crystal bulk silicon carbide substrate having a micropipe density of between about 50 and 400 per square centimeter on its surface, and an epitaxial layer of silicon carbide on a surface of the silicon carbide substrate in which the epitaxial layer has a micropipe density of between about 0 and 50 per square centimeter on its surface.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
FIG. 1 is an optical micrograph of the surface of an epitaxial layer formed according to the present invention.

In a first embodiment, the invention comprises a method of producing epitaxial layers of silicon carbide that are substantially free of micropipe defects by first growing a bulk crystal of silicon carbide using a seeded sublimation technique. As used herein, a seeded sublimation technique refers to a sublimation technique other than those generally referred to as the "Lely" or "Acheson" techniques. As generally known to those of ordinary skill in this art, the Lely technique is an unseeded sublimation-type growth of silicon carbide from silicon carbide powder in a furnace, usually of graphite.

The Acheson technique generally comprises filling a furnace with appropriate powder materials such as coke, graphite and silica in an appropriate stoichiometric mix. The packed solid mixture is heated sufficiently to form silicon carbide crystals in the packed mixture. Examples in the patent literature include U.S. Pat. Nos. 5,265,118 to Takenaka, et al., issued on Nov. 23, 1993, and to Kuriakose, U.S. Pat. No. 4,419,336, issued on Dec. 6, 1983. It will be understood, however, that these are simply illustrative of more recent Acheson techniques.

In contrast, in the invention, the bulk single crystal is grown using the technique described by Carter, et al. in U.S. Pat. No. 4,866,005, assigned to the assignee of the present invention, and the contents of which are incorporated entirely herein by reference (or one substantially similar to it). This technique has been proven to be the presently most successful method of growing high quality large single crystals of silicon carbide of a desired polytype (i.e., crystals with diameters of one inch or more) useful for producing wafers for epitaxial growth and the other necessary precursors to useable commercial devices, rather than just of theoretical or laboratory interest. It has been found, however, that although crystals formed according to the Carter technique are generally of much higher quality than those formed by prior techniques, they are still susceptible to micropipe defects. As noted earlier, these defects present little or no problem for certain lower power devices, but present significant problems at higher power, current and voltage levels.

Furthermore, it has been discovered that chemical vapor deposition growth, which has become more and more successful in the last decade (see, e.g., Davis, et al., U.S. Pat. Nos. 4,912,063, and 4,912,064), tends to faithfully reproduce the micropipe defects that occur in the bulk silicon carbide crystals grown by seeded sublimation.

Thus, in the second step, the invention comprises forming a first epitaxial layer of silicon carbide on the substrate using a liquid phase epitaxy technique and under the proper growth conditions as set forth herein until the layer has a thickness sufficient to close micropipe defects propagated by the substrate into the growth of the first epitaxial layer so that the reproduction of micropipe defects is substantially reduced, and potentially entirely eliminated, in the melt growth of the first epitaxial layer. The general principles of liquid phase epitaxy are of course well known to those in the crystal-growing arts, and the particular conditions required for particular tasks can be determined by those of ordinary skill in this art and without undue experimentation. Specific background techniques that are particularly illustrative and useful in silicon carbide are set forth in, for example, Dmitriev, et al., *Silicon Carbide and SiC-ALN Solid-Solution P-N Structures Grown by Liquid-Phase Epitaxy*, Physica B. 185 (1993), pp. 440–452.

As a final step, and to form the electronically active region for device formation, the last step in the method comprises forming a second epitaxial layer of silicon carbide on the first epitaxial layer of silicon carbide by chemical vapor deposition.

Although the inventors do not wish to be bound by any particular theory of the invention, it is hypothesized that the thickness and speed of LPE growth as opposed to CVD growth encourages the micropipes to close faster and more completely in LPE growth than in CVD growth.

In preferred embodiments, the bulk single crystal is of the 6H polytype and the first epitaxial layer similarly comprises the 6H polytype. In other preferred embodiments, the bulk single crystal is the 4H polytype and the epitaxial layer is similarly the 4H polytype.

In one embodiment of the invention, the step of forming the first epitaxial layer comprises forming the first layer with a first conductivity type and the step of forming the second epitaxial layer comprises forming the second layer with the opposite conductivity type from the first layer to thereby form a p-n junction between the first and second epitaxial layers.

In another embodiment, the method comprises forming both the first and second epitaxial layers of the same conductivity type and then forming a third epitaxial layer on the second layer with the third epitaxial layer having the opposite conductivity type from the first and second layers to thereby form a p-n junction between the second and third epitaxial layers.

In another aspect, it has been determined according to the present invention that the successful solution growth of silicon carbide by liquid phase epitaxy is promoted by the presence of another element that enhances the solubility of silicon carbide in the melt. In this embodiment, the method of producing epitaxial layers that are substantially reduced or free of micropipe defects comprises growing an epitaxial layer of silicon carbide on a silicon carbide substrate by liquid phase epitaxy from a melt of silicon carbide in silicon and an element that enhances the solubility of silicon carbide in that melt, and in which the atomic percentage of that element predominates over the atomic percentage of silicon. The method further comprises closing micropipe defects propagated by the substrate into the epitaxial layer by continuing to grow the epitaxial layer until the epitaxial layer has a thickness at which micropipe defects present in the substrate are substantially no longer reproduced in the epitaxial layer, and the number of defects in the epitaxial layer is thus substantially reduced.

In preferred embodiments, the additional element in the melt comprises germanium so that the epitaxial layer is grown in a melt of silicon and germanium. More preferably, the atomic percentage of germanium in the melt is between about 70 and 90 atomic percent, with atomic percentages of germanium of between about 75 and 80 percent being most preferred.

From a functional standpoint, the amount of the other element, preferably germanium, can be described as a sufficient atomic percentage of silicon to foster an appropriate growth rate, but less than the amount of silicon that would produce spontaneous generation of crystals in the melt. The solubility enhancing element (preferably germanium) should be present in a sufficient atomic percentage to optimize the growth of silicon carbide in the melt, but less than an amount that would graphitize the surface of the growing epitaxial layer. As is known to those familiar with these crystal-growing techniques, graphite is quite often used as the vessel or susceptor for epitaxial growth. Too much silicon in the melt tends to etch the graphite susceptor as it forms silicon carbide, while too high a percentage of a third element such as germanium tends to foster the growth of graphite ("graphitization") on the surface of the epitaxial layer.

As set forth in the experimental section hereafter, the step of growing the epitaxial layer on a silicon carbide substrate preferably comprises growing the layer at a solution temperature of between about 1600° and 1800° C. As also mentioned earlier, it appears that the additional thickness that can be generated in the epitaxial layer through LPE is useful in closing the micropipe defects. Thus, the preferred method is to grow the epitaxial layer to a thickness of between about 40 and 70 microns, with a thickness of between about 50 and 60 microns most preferred, although thicknesses as low as 20 microns have proven to be sufficient in some circumstances.

As in the first embodiment, the method can further comprise the step of forming another epitaxial layer of silicon carbide on a first epitaxial layer using chemical vapor deposition. As in the first embodiment, the second epitaxial layer can be made of the opposite conductivity type from the first epitaxial layer (usual dopants for silicon carbide include nitrogen (N) for n-type and aluminum (Al) for p-type), or potentially forming both epitaxial layers of the same conductivity type and then forming a third conductivity type layer in order to provide the junction structure useful in so many semiconductor devices.

In another aspect, the invention comprises a silicon carbide structure of high quality that is particularly useful in power electronic devices. The structure can be best described as a single crystal bulk silicon carbide substrate with an epitaxial layer of silicon carbide on a surface of the silicon carbide substrate characterized in that the epitaxial layer demonstrates an x-ray rocking curve having a full width of 25 arc seconds or less at half maximum. As is known to those familiar with the measurement and evaluation of crystal structures, the x-ray rocking curve represents the width of an x-ray diffraction peak produced by a given crystal. Wider peaks tend to indicate poorer crystal quality because they represent more scattered diffraction of incident x-rays trained upon the crystal. Alternatively, narrower x-ray rocking curves represent higher or better crystal quality because they approach the ideal (but practically unattainable) situation in which a perfect crystal would only diffract a single incident wavelength.

This structure can be further described, and the value of the invention further understood, because the substrate can demonstrate an x-ray rocking curve having a full width of about 100 arc seconds or less at half maximum. The reduction in the x-ray rocking curve between the substrate and the epitaxial layer demonstrates the advantages of the present invention. As in the previously described method embodiments, the substrate and epitaxial layer can both be of the 6H polytype, or both of the 4H polytype. Additionally, a preferred thickness of the epitaxial layer is between about 25 and 75 microns, with the most preferred thickness being between about 40 and 70 microns.

Using the method technique of the present invention, a silicon carbide structure can be produced in which the epitaxial layer is substantially circular and has a diameter of at least one inch, and potentially two inches or larger, while still demonstrating the exceptional crystal quality exemplified by the narrow x-ray rocking curve.

As in all of the previous embodiments, the structure can further comprise a second epitaxial layer having the opposite conductivity type from the first epitaxial layer so that the epitaxial layers form a p-n junction.

In yet another embodiment, the invention can comprise a silicon carbide structure of high quality, particularly for use in power electronic devices, which comprises a single crystal bulk silicon carbide substrate having a micropipe density of between about 50 and 400 per square centimeter on its surface, and an epitaxial layer of silicon carbide on said surface of that substrate having a micropipe density reduced to between about 0 and 50 per square centimeter on its surface.

As in the previous embodiments, the substrate and epitaxial layer can both be the 6H or 4H polytypes, the preferred thickness is between about 40 and 70 microns, and the substrates and epitaxial layers can be produced with diameters of at least about one inch, and with appropriate junction epitaxial layers thereon.

The advantages of the invention are further illustrated in the drawings. FIG. 1 is an optical micrograph and an accompanying schematic showing the surface characteristics of an epitaxial layer grown according to the present invention. The arrow in the schematic portion of FIG. 1 begins at the surface of the epitaxial layer to show the point from which the micrograph was taken. By comparison, FIG. 2, in which the arrow indicates that the micrograph was taken from the substrate, shows a great number of defects including several large micropipe defects at the top, bottom center, and bottom left-hand portions of FIG. 2. The existence of these in FIG. 2, and their elimination and absence from FIG. 1, are illustrative of the benefits of the present invention.

Figure 2:
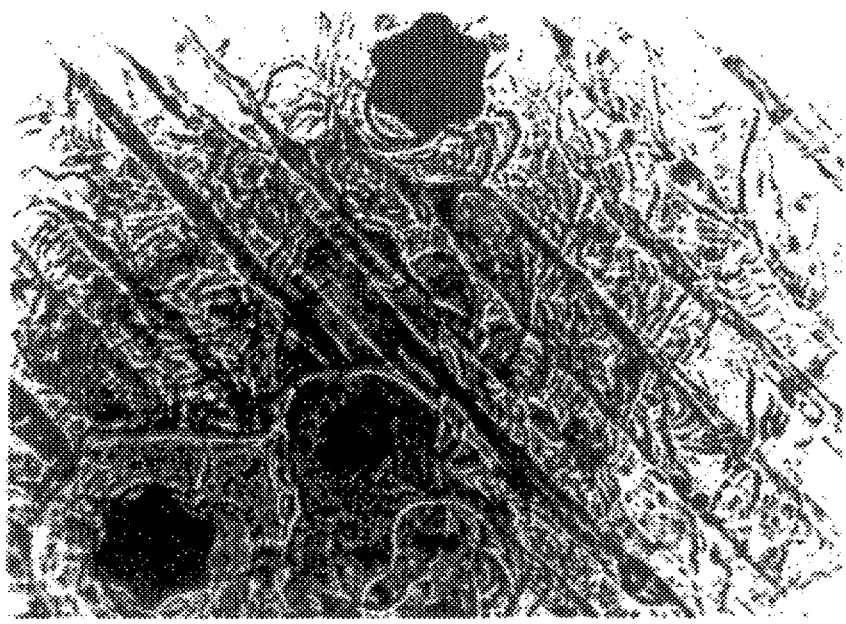
FIG. 2 is an optical micrograph taken through the substrate upon which the epitaxial layer of FIG. 1 was grown, and showing in comparison the large number of defects present in the substrate that are not reproduced in the surface illustrated in FIG. 1.
Figure 3:
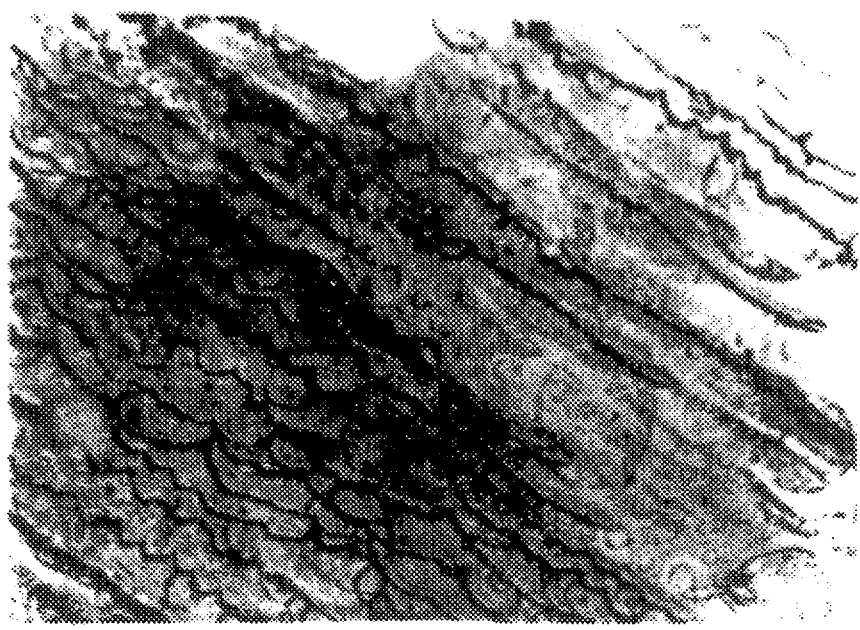
FIG. 3 is another optical micrograph similar to FIG. 1 illustrating the surface of an epitaxial layer according to the present invention.
Figure 4:
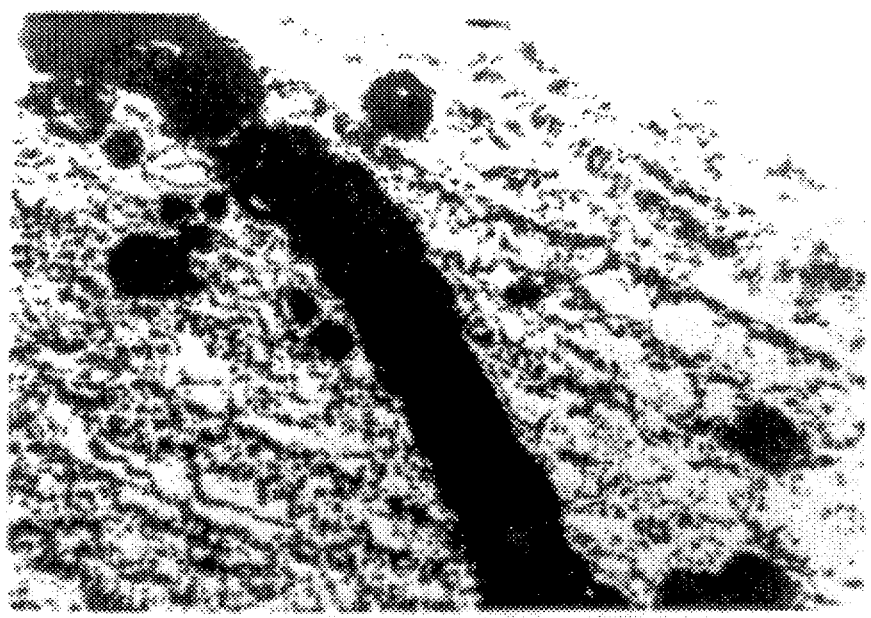
FIG. 4 is another micrograph corresponding to FIG. 2 and taken through the substrate upon which the epitaxial layer of FIG. 3 was grown.

FIGS. 3 and 4 are in the same relationship to one another as FIG. 1 and 2 were to one another. Again, FIG. 4 shows a significant number of large defects in the substrate, while FIG. 3 shows a much improved surface from which the micropipes visible in FIG. 4 are eliminated.

Figure 5:
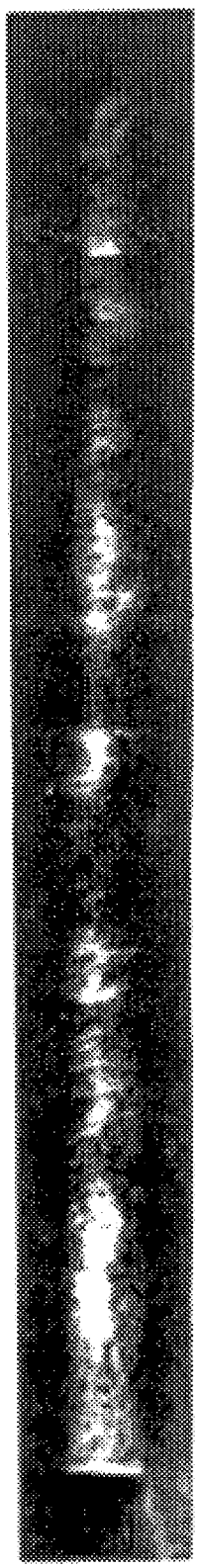
FIG. 5 is a cross-sectional x-ray topography of the silicon carbide substrate with an epitaxial layer thereon according to the present invention.

FIG. 5 is a cross-sectional x-ray topograph of the silicon carbide substrate with an epitaxial layer grown by LPE according to the present invention beginning at the point of the arrow. The consistent appearance from substrate through the epitaxial layer is illustrative of the crystal growth advantages of the present invention.

Figure 6:
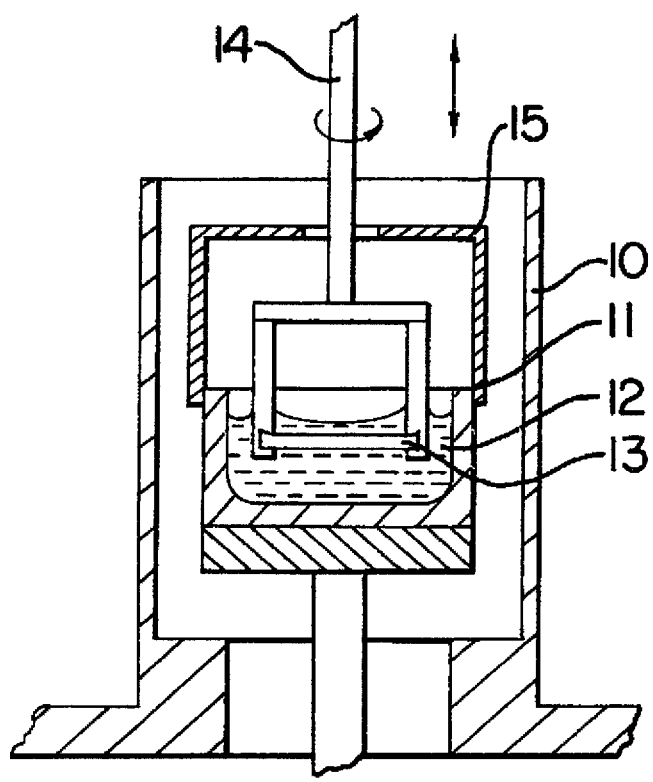
FIG. 6 is a schematic diagram of a liquid phase epitaxy (LPE) growth system useful in the method of the present invention.

FIG. 6 is a schematic cross-sectional view of a liquid phase epitaxy growth cell used to form the epitaxial layers of the present invention. The cell includes a graphite heater 10, a crucible 11, the melt of silicon and preferably germanium 12, and the silicon carbide wafer 13 upon which growth takes place. Preferably, the cell of FIG. 6 is used in conjunction with a dipping-rotating technique using the rotating support 14 which both dips and rotates the silicon carbide wafer 13 in the melt 12. The use of the cell of FIG. 6 is described in more detail in the following section.

EXPERIMENTAL PROCEDURE

Homoepitaxial layers of 6H and 4H polytypes are grown on corresponding silicon carbide wafers as substrates. The wafers are 30 millimeters in diameter and are grown by a sublimation technique, for example, the technique described by Carter, et al. in previously incorporated U.S. Pat. No. 4,866,005. After being cut from the boule, the wafers are polished and etched to remove the surface layer damaged by mechanical treatment.

Next, the defects in the crystal structure of the wafers are studied prior to the liquid phase epitaxy growth. The wafers are characterized by chemical etching in molten potassium hydroxide (KOH) for five minutes at 500° C. The etching process makes crystal macro defects such as micropipes, polytype, inclusions, and dislocations that penetrate the surface clearly visible under optical microscopy. Additionally, the number of micropipes in an etched wafer are counted with an imaging and digitizing system. The digitizing system precisely determines the locations of the micropipes on the wafer.

The crystal defect locations and density can also be determined by x-ray topography. X-ray diffraction is used to characterize the crystal quality by measuring the full width of the x-ray rocking curve. Differential x-ray diffractometry in turn gives information about x-ray scattering intensity distribution near a reciprocal lattice site. Rocking curves of both the θ and θ-2θ scans are recorded by a double-crystal x-ray spectrometer using copper $K_\alpha$ radiation and a defect-free silicon carbide Lely crystal with (0001) orientation as the monochromator.

A microcathodoluminescence setup installed in a scanning electron microscope (SEM) is also used to study the nature of the defects. The technique is extremely helpful to investigate and identify small inclusion of different polytypes in silicon carbide. Finally, the quality of the wafer surface treatment prior to epitaxial growth is studied by RHEED.

The liquid phase epitaxial growth is carried out using a carbon solution in a silicon-germanium (SiGe) melt in a temperature range of between about 1600° to 1800° C. The growth is carried out in a resistively-heated furnace capable of temperatures up to about 2500° C. with the temperature during epitaxial growth being measured and monitored by tungsten/ruthenium (W/Re) thermocouples.

A dipping-rotation technique is employed for growth. The silicon carbide wafer is fixed in a graphite holder and loaded in the furnace together with the graphite crucible containing approximately 30 grams of a mixture of silicon and germanium (Si/Ge). After loading, the growth chamber is evacuated for 30 minutes to remove oxygen, and then filled with high purity helium (He). The crucible with the charge is then heated up to the melting point of silicon (1403° C.). After the Si/Ge mixture melts, a silicon carbide wafer is moved downwardly relatively close to the melt surface. The wafer is kept for 15 minutes in this close, but not immersed, position to reduce thermal stress that may otherwise be generated when the wafer is dipped into the melt.

The wafer is next slowly immersed into the melt which is then increased to the desired growth temperature. During the growth cycle, the temperature is maintained constant, so that growth takes place in the temperature gradient existing in the crucible. The temperature of the melt surface is maintained approximately 30° lower than the temperature at the bottom of the crucible. The Si/Ge melt is kept saturated with carbon that dissolves from the graphite crucible walls. Growth time can be varied in the range of from about 30 to 240 minutes (one-half hour to four hours) depending upon the growth temperature and the melt composition in order to keep the thickness of the epitaxial layer on the order of between about 10 and 50 microns. After epitaxial growth is complete, the sample is removed and the furnace cooled. If melt droplets remain on the sample or substrate holder, they are removed by chemical etching in a mixture of hydrofluoric and nitric acids ($HF-HNO_3$), following which the sample is cleaned in a usual RCA procedure.

Following growth, the epitaxial layers are characterized using several techniques including optical microscopy with ultraviolet excitation, angle lapping, electron microscopy, and RHEED. When the epitaxial layers are to be used later as a seed for further epitaxial or bulk growth, the quality of the material grown on top of the LPE layer is determined by evaluating the surface morphology and crystal structure.

The crystal structure of the grown layers are also studied by the same techniques used to study the surface prior to the epitaxial growth, including x-ray topography and x-ray diffraction. X-ray topography is used to determine the depth profile of the defect distribution in the layers. The wafers are also re-etched in molten KOH at 500° C., and the surface image again digitized to determine the extent to which the micropipes and the other defects have been reduced. The distribution and density of the defects in the epitaxial layer are then compared with the distribution and density of the defects in the initial wafer.

The degree to which defects propagate from the wafer into the silicon carbide epitaxial layer is studied by transmission electron microscopy (TEM). Both plan view and cross-sectional TEM techniques are used to determine the defect distribution at the substrate-epitaxial layer interface, as well as to study the mechanism of micropipe formation and termination. Microcathodoluminescence and TEM are used to investigate the crystal structure quality above the micropipes.

Preliminary results indicate that growth temperature, growth rate, and layer thickness are all critical in preventing micropipe propagation in the silicon carbide epitaxial layer during LPE growth.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method of producing epitaxial layers of silicon carbide that are substantially free of micropipe defects, the method comprising:
    growing a bulk crystal of silicon carbide using a seeded sublimation technique;
    cutting a substrate from the bulk crystal;
    depositing a first epitaxial layer of silicon carbide on the substrate produced from the bulk crystal using a liquid phase epitaxy technique until the deposited first epitaxial layer has a thickness sufficient to close micropipe defects propagated by the substrate into the growth of the first epitaxial layer so that the reproduction of micropipe defects is substantially reduced in the melt growth of the first epitaxial layer; and thereafter
    depositing a second epitaxial layer of silicon carbide on the first epitaxial layer of silicon carbide by chemical vapor deposition.

2. An epitaxial growth method according to claim 1 wherein the step of growing a bulk single crystal comprises growing a bulk single crystal of the 6H polytype, and the step of forming a first epitaxial layer comprises forming the first epitaxial layer of the 6H polytype.

3. An epitaxial growth method according to claim 1 wherein the step of growing a bulk single crystal comprises growing a bulk single crystal of the 4H polytype, and the step of forming a first epitaxial layer comprises forming the first epitaxial layer of the 4H polytype.

4. An epitaxial growth method according to claim 1 wherein the step of forming a first epitaxial layer comprises forming the first epitaxial layer with a first conductivity type, and the step of forming a second epitaxial layer comprises forming the second layer with the opposite conductivity type from the first epitaxial layer to thereby form a p-n junction between said first and second epitaxial layers.

5. An epitaxial growth method according to claim 1 wherein the steps of forming the first and second epitaxial layers comprises forming the first and second epitaxial layers with a first conductivity type, and further comprising the step of forming a third epitaxial layer with the opposite conductivity type on the second epitaxial layer to thereby form a p-n junction between said second and third epitaxial layers.

6. A method of producing epitaxial layers of silicon carbide that are substantially free of micropipe defects, the method comprising:
    growing an epitaxial layer of silicon carbide on a silicon carbide substrate by liquid phase epitaxy from a melt of silicon carbide in silicon and another element that enhances the solubility of silicon carbide in the melt, and in which the atomic percentage of that element predominates over the atomic percentage of silicon; and
    closing micropipe defects propagated by the substrate into the epitaxial layer by continuing to grow the epitaxial layer until the epitaxial layer has a thickness at which micropipe defects present in the substrate are substantially no longer reproduced in the epitaxial layer, and the number of micropipe defects in the epitaxial layer is substantially reduced.

7. A method of producing epitaxial layers according to claim 6 wherein the step of growing the epitaxial layer in a melt of silicon and another element comprises growing the epitaxial layer in a melt of silicon and germanium.

8. A method of producing epitaxial layers according to claim 7 wherein the step of growing the epitaxial layer from the melt comprises growing the epitaxial layer in a melt in which the atomic percentage of germanium is between about 70 and 90 percent.

9. A method of producing epitaxial layers according to claim 7 wherein the step of growing the epitaxial layer from the melt comprises growing the epitaxial layer in a melt in which the atomic percentage of germanium is between about 75 and 80 percent.

10. A method of producing epitaxial layers according to claim 6 wherein the step of growing the epitaxial layer in a melt of silicon and another element comprises growing the epitaxial layer in a melt with:
    a sufficient atomic percentage of silicon to foster an appropriate growth rate, but less than the amount of silicon that would produce spontaneous generation of crystals in the melt; and
    a sufficient atomic percentage of the solubility-enhancing element to optimize the growth of silicon carbide in the melt, but less than an amount that would graphitize the surface of the growing epitaxial layer.

11. A method of producing epitaxial layers according to claim 6 wherein the step of growing the epitaxial layer on a silicon carbide substrate comprises growing the layer on a substrate that is characterized by a micropipe density of between about 50 and 400 per square centimeter ($cm^{-2}$).

12. A method of producing epitaxial layers according to claim 6 wherein the step of growing the epitaxial layer on a silicon carbide substrate comprises growing the layer at a solution temperature of between about 1600° and 1800° C.

13. A method of producing epitaxial layers according to claim 6 wherein the step of growing the epitaxial layer on a silicon carbide substrate comprises growing the epitaxial layer to a thickness of between about 20 and 70 microns.

14. A method of producing epitaxial layers according to claim 6 and further comprising the step of forming a second epitaxial layer of silicon carbide on the first epitaxial layer of silicon carbide by chemical vapor deposition.

15. A method of producing epitaxial layers according to claim 14 wherein the step of forming a first epitaxial layer comprises forming the first epitaxial layer with a first conductivity type, and the step of forming a second epitaxial layer comprises forming the second layer with the opposite conductivity type from the first epitaxial layer to thereby form a p-n junction between said first and second epitaxial layers.

16. A method of producing epitaxial layers according to claim 14 wherein the steps of forming the first and second epitaxial layers comprises forming the first and second epitaxial layers with a first conductivity type, and further comprising the step of forming a third epitaxial layer with the opposite conductivity type on the second epitaxial layer to thereby form a p-n junction between the second and third epitaxial layers.

17. A method of producing epitaxial layers of silicon carbide that are substantially free of micropipe defects, the method comprising:

growing a bulk crystal of silicon carbide using a seeded sublimation technique;

cutting a substrate from the bulk crystal;

depositing a first epitaxial layer of silicon carbide on the substrate produced from the bulk crystal using a liquid phase epitaxy technique until the deposited first epitaxial layer has a thickness sufficient to close micropipe defects propagated by the substrate into the growth of the first epitaxial layer so that the reproduction of micropipe defects is substantially reduced in the melt growth of the first epitaxial layer; and thereafter seeding a silicon carbide sublimation growth technique with the substrate and the deposited epitaxial layer.

18. A silicon carbide structure of high quality, particularly for use in power electronic devices, said structure comprising:

a single crystal bulk silicon carbide substrate; and an epitaxial layer of silicon carbide on a surface of said silicon carbide substrate;

characterized in that said epitaxial layer demonstrates an X-ray rocking curve having a full width of 25 arc seconds or less at half maximum.

19. A silicon carbide structure according to claim 18 wherein said substrate demonstrates an X-ray rocking curve having a full width of about 100 arc seconds or less at half maximum.

20. A silicon carbide structure according to claim 18 wherein said substrate is of the 6H polytype and said epitaxial layer is of the 6H polytype.

21. A silicon carbide structure according to claim 18 wherein said substrate is of the 4H polytype and said epitaxial layer is of the 4H polytype.

22. A silicon carbide structure according to claim 18 wherein said epitaxial layer is between about 25 and 75 microns thick.

23. A silicon carbide structure according to claim 18 wherein said epitaxial layer is between about 20 and 70 microns thick.

24. A silicon carbide structure according to claim 18 wherein said epitaxial layer is substantially circular and has a diameter of at least one inch.

25. A silicon carbide structure according to claim 18 and further comprising a second epitaxial layer having the opposite conductivity type from said first epitaxial layer so that said epitaxial layers form a p-n junction.

26. A silicon carbide structure of high quality, particularly for use in power electronic devices, said structure comprising:

a single crystal bulk silicon carbide substrate having a micropipe density of between about 50 and 400 $cm^{-2}$ on its surface; and an epitaxial layer of silicon carbide on said surface of said silicon carbide substrate, said epitaxial layer having a micropipe density of between about 0 and 50 $cm^{-2}$ on its surface.

27. A silicon carbide structure according to claim 26 wherein said substrate is of the 6H polytype and said epitaxial layer is of the 6H polytype.

28. A silicon carbide structure according to claim 26 wherein said substrate is of the 4H polytype and said epitaxial layer is of the 4H polytype.

29. A silicon carbide structure according to claim 26 wherein said epitaxial layer is between about 20 and 75 microns thick.

30. A silicon carbide structure according to claim 26 wherein said epitaxial layer is between about 40 and 70 microns thick.

31. A silicon carbide structure according to claim 26 wherein said epitaxial layer is substantially circular and has a diameter of at least one inch.

32. A silicon carbide structure according to claim 26 and further comprising a second epitaxial layer having the opposite conductivity type from said first epitaxial layer so that said epitaxial layers form a p-n junction.

* * * * *